United States Patent
Bang

(10) Patent No.: US 8,027,163 B2
(45) Date of Patent: Sep. 27, 2011

(54) DISPLAY DEVICE

(75) Inventor: Won-Kyu Bang, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 12/619,544

(22) Filed: Nov. 16, 2009

(65) Prior Publication Data

US 2010/0142151 A1  Jun. 10, 2010

(30) Foreign Application Priority Data

Dec. 5, 2008  (KR) .................. 10-2008-0123224

(51) Int. Cl.
*H05K 7/20* (2006.01)

(52) U.S. Cl. ............... 361/704; 361/707; 361/679.21; 345/905

(58) Field of Classification Search .............. None
See application file for complete search history.

(56) References Cited

U.S. PATENT DOCUMENTS

| | | | |
|---|---|---|---|
| 7,218,521 B2 * | 5/2007 | Kim ............... | 361/704 |
| 7,372,699 B2 * | 5/2008 | Kim ............... | 361/704 |
| 7,375,969 B2 * | 5/2008 | Jeong ............. | 361/719 |
| 7,388,748 B2 * | 6/2008 | Shin .............. | 361/704 |
| 7,414,204 B2 * | 8/2008 | Ahn et al. ........ | 174/541 |
| 7,423,878 B2 * | 9/2008 | Kim ............... | 361/704 |
| 7,447,034 B2 * | 11/2008 | Shin ............. | 361/714 |
| 7,530,703 B2 * | 5/2009 | Ryu ............... | 362/29 |
| 7,561,427 B2 * | 7/2009 | Jeong ............. | 361/704 |
| 7,639,489 B2 * | 12/2009 | Miyoshi et al. .... | 361/679.34 |
| 7,660,105 B2 * | 2/2010 | Hwang ............. | 361/679.27 |
| 7,843,116 B2 * | 11/2010 | Lin et al. ........ | 313/46 |

FOREIGN PATENT DOCUMENTS

| | | |
|---|---|---|
| KR | 10-2005-0052612 A | 6/2005 |
| KR | 10-2006-0031904 A | 4/2006 |
| KR | 10-2006-0119323 A | 11/2006 |
| KR | 10-0649216 B1 | 11/2006 |
| KR | 10-0759574 B1 | 9/2007 |
| KR | 10-2007-0120306 A | 12/2007 |
| KR | 10-2009-0013507 A | 2/2009 |

* cited by examiner

*Primary Examiner* — Boris L Chervinsky
(74) *Attorney, Agent, or Firm* — Knobbe Martens Olson & Bear LLP

(57) ABSTRACT

A display device is disclosed. In one embodiment, the display device includes i) a display panel configured to display an image, ii) a chassis base configured to support the display panel, iii) an auxiliary chassis disposed between the display panel and the chassis base, wherein one end of the auxiliary chassis covers and contacts an edge of the chassis base. The display device further includes i) a driving board disposed at the back of the chassis base and configured to drive the display panel and ii) at least one signal transmission member comprising at least one circuit device and configured to electrically connect the display panel and the driving board, wherein one side of the at least one signal transmission member is supported by the auxiliary chassis, and wherein the one side faces the edge of the chassis base.

18 Claims, 4 Drawing Sheets

DISPLAY DEVICE

CROSS-REFERENCE TO RELATED PATENT APPLICATION

This application claims the benefit of Korean Patent Application No. 10-2008-0123224, filed on Dec. 5, 2008, in the Korean Intellectual Property Office, the disclosure of which is incorporated herein in its entirety by reference.

BACKGROUND OF THE INVENTION

1. Field of the Invention

Example embodiments relates to a display device, and more particularly, to a display device that includes an auxiliary chassis supporting a signal transmission member which connects a display panel and a driving board.

2. Description of the Related Technology

A plasma display device is a flat display device that includes an electrode on each of the surfaces of substrates that face each other. The plasma display device realizes an image by using light emitted due to ultraviolet radiation generated in a discharge space by applying a predetermined voltage between the substrates while discharge gas is filled in the discharge space. The plasma display device has come into the spotlight because it typically has a thickness of several centimeters or lower, and a large screen and large view angle.

SUMMARY OF CERTAIN INVENTIVE ASPECTS

One aspect of the present invention is a display device that includes a chassis base assembly suitable in a display panel that is large and thin, and is precise and detailed to realize a high resolution image.

Another aspect of the present invention is a display device that effectively radiates heat as a circuit device that generates heat is stably supported even when a large display panel is bended at the edge.

Another aspect of the present invention is a signal transmission member that connects a display panel and a driving board and has a minimized length.

Another aspect of the present invention is a display device having a minimized thickness by reducing a thickness of a chassis base.

Another aspect of the present invention is a display device including an auxiliary chassis supporting a signal transmission member connecting a display panel and a driving board by being disposed between the display panel and a chassis base.

The display device may include: a display panel displaying an image; a chassis base disposed at the back of the display panel; an auxiliary chassis disposed between the display panel and the chassis base so that one end of the auxiliary chassis protrudes outside of the chassis base; a driving board disposed at the back of the chassis base and drives the display panel; and at least one signal transmission member connecting the display panel and the driving board with at least one circuit device, and having one side supported by the auxiliary chassis.

The chassis base may include a groove in a front side facing the display panel, and the auxiliary chassis may include an installer, which is fixed in the groove and disposed between the display panel and the chassis base, and a supporter, which is bended at the end of the installer to cover at least a portion of a side of the chassis base.

The signal transmission member may be a tape carrier package or a chip on film.

The signal transmission member may contact the supporter via a first heat transmission medium that is interposed between the signal transmission member and the supporter.

The first heat transmission member may be thermal grease or a thermal conduction sheet.

The circuit device may be disposed on a side of the signal transmission member opposite of a side where the first heat transmission member is attached.

The display device may further include a protection plate combined to the chassis base so as to cover the signal transmission member, wherein the circuit device may be disposed on a side of the signal transmission member facing the protection plate so as to contact the protection plate.

The circuit device may contact the protection plate via a second heat transmission member that is interposed between the circuit device and the protection plate. The second heat transmission member may be thermal grease or a thermal conduction sheet.

The circuit device may be longitudinally disposed along a direction where the signal transmission member extends from the driving board to the display panel. Another aspect of the invention is a display device including: a display panel configured to display an image; a chassis base configured to support the display panel; an auxiliary chassis disposed between the display panel and the chassis base, wherein one end of the auxiliary chassis covers and contacts an edge of the chassis base; a driving board disposed at the back of the chassis base and configured to drive the display panel; and at least one signal transmission member including at least one circuit device and configured to electrically connect the display panel and the driving board, wherein one side of the at least one signal transmission member is supported by the auxiliary chassis, and wherein the one side faces the edge of the chassis base.

In the above device, a groove is defined in a surface of the chassis base, wherein the surface faces the display panel, wherein the surface of the chassis base is substantially perpendicular to the edge of the chassis base, and wherein the auxiliary chassis may include i) an installer, which is formed in the groove and disposed between the display panel and the chassis base, and ii) a supporter, which is bended at the end of the installer to cover and contact the edge of the chassis base.

In the above device, the signal transmission member is a tape carrier package or a chip on film. The above device may further include a first heat transmission medium, wherein the first heat transmission medium includes first and second surfaces opposing each other, wherein the first surface contacts the supporter, and wherein the second surface contacts the signal transmission member. In the above device, the first heat transmission member is thermal grease or a thermal conduction sheet. In the above device, the signal transmission member includes first and second surfaces opposing each other, wherein the first surface of the signal transmission member contacts the first heat transmission medium, and wherein the circuit device is disposed on the second surface of the signal transmission member.

The above device may further include a second heat transmission member contacting the second surface of the signal transmission member and covering the circuit device. The above device may further include a protection plate covering a substantial portion of the at least one signal transmission member so as to protect the signal transmission member. In the above device, a cross-section of the protection plate has a substantially similar shape to that of each of the at least one signal transmission member. In the above device, the protection plate contacts the second heat transmission member.

Another aspect of the invention is a display device including: a display panel configured to display an image; a chassis base configured to support the display panel, wherein the chassis base may include i) first and second linear portions, and ii) a connection portion which are integrally formed into the chassis base, wherein the connection portion interconnects the first and second linear portions, and wherein the connection portion is bent outwardly from the first linear portion to the second linear portion such that the second linear portion is farther than the first linear portion from the display panel; an auxiliary chassis a substantial portion of which is formed between the display panel and the second linear portion of the chassis base, wherein the auxiliary chassis is smaller and shorter than the chassis base; and at least one signal transmission member configured to transmit at least a driving signal to the display panel, wherein one side of the at least one signal transmission member is supported by the auxiliary chassis.

In the above device, the auxiliary chassis may include i) a first portion and ii) a second portions which extends from the first portion and is substantially perpendicular to the first portion, wherein the first portion is formed between the display panel and the chassis base, and wherein the first portion of the auxiliary chassis is substantially parallel with the second linear portion of the chassis base. In the above device, the second linear portion of the chassis base includes first and second surfaces, wherein the first surface of the chassis base faces the display panel and is substantially perpendicular to the second surface, wherein the first portion of the auxiliary chassis contacts the first surface of the chassis base, and wherein the second portion of the auxiliary chassis contacts the second surface of the chassis base.

In the above device, the first portion of the auxiliary chassis contacts the second linear portion and the connection portion of the chassis base. The above device may further include an adhesive tape formed between the display panel and the chassis base, wherein the first portion of the auxiliary chassis contacts the adhesive tape. The above device may further include a heat radiation sheet formed between the display panel and the chassis base, wherein the first portion of the auxiliary chassis contacts the heat radiation sheet.

The above device further includes a first heat transmission medium interposed between the second portion of the auxiliary chassis and a first surface of the signal transmission member. The above device may further include i) at least one circuit device formed on a second surface of the signal transmission member and ii) a second heat transmission member contacting the second surface of the signal transmission member and covering the circuit device, and wherein the first and second surfaces of the signal transmission member are opposing to each other. The above device may further include a protection plate which contacts the second heat transmission member, wherein a cross-section of the protection plate has a substantially similar shape to that of each of the at least one signal transmission member.

Still another aspect of the invention is a display device including: a display panel configured to display an image; a chassis base configured to support the display panel, wherein a groove is defined in a surface of the chassis base, wherein the surface faces the display panel; an auxiliary chassis, a substantial portion of which is formed in the groove of the chassis base, wherein at least a portion of the auxiliary chassis contacts an edge of the chassis base and is not formed between the display panel and chassis base, and wherein the edge of the chassis base is substantially perpendicular to the surface of the chassis base; a driving board connected to the chassis base and configured to generate a driving signal for the display panel; at least one signal transmission member configured to transmit the driving signal to the display panel, wherein one side of the at least one signal transmission member is supported by the auxiliary chassis; and a protection plate covering a substantial portion of the at least one signal transmission member so as to protect the signal transmission member.

Still another aspect of the invention is a display device including: a display panel configured to display an image; a chassis base configured to support the display panel; an auxiliary chassis disposed between the display panel and the chassis base, wherein one end of the auxiliary chassis covers an edge of the chassis base; a driving board disposed at the back of the chassis base and configured to drive the display panel; and at least one signal transmission member comprising at least one circuit device and configured to electrically connect the display panel and the driving board, wherein one side of the at least one signal transmission member is supported by the auxiliary chassis.

In the above device, a groove may be defined in a surface of the chassis base, wherein the surface faces the display panel, and wherein the auxiliary chassis comprises i) an installer, which is formed in the groove and disposed between the display panel and the chassis base, and ii) a supporter, which is formed at the end of the installer to cover and contact the edge of the chassis base.

DETAILED DESCRIPTION OF CERTAIN INVENTIVE EMBODIMENTS

Generally, the plasma display device includes a chassis base that stably supports a plasma display panel that is highly breakable. The chassis base includes driving boards for driving the plasma display panel, wherein the driving boards are connected to the plasma display panel by a signal transmission member, such as a tape carrier package (TCP).

Since a driving integrated circuit (IC) mounted on the TCP repeatedly performs a switching operation according to signals applied from the driving boards, heat is generated in the driving IC. Accordingly, while designing the plasma display device, a technology of emitting heat generated in the driving IC plays an important role.

Generally, a driving IC is disposed to contact a reinforcement member that is installed to strengthen the hardness of a chassis base so as to emit heat generated in the driving IC, but such a technology is not suitable to recent plasma display devices that have a thin thickness, a large screen size, and high resolution.

As the resolution of plasma display panels increases, a structure of electrodes is becoming precise and detailed, and thus a circuit pattern of a TCP and the number of driving ICs increases. In order for the driving ICs to effectively emit heat, the contact between the driving ICs and the reinforcement members generally needs to be stable.

However, when a screen size of the plasma display device is large, the plasma display panel and the chassis base may bend at the edges. Since the reinforcement member is a separate member installed in the chassis base, the reinforcement member does not bend at the radius of curvature that is identical to that of the plasma display panel and the chassis base at the edges. Accordingly, when the TCP and the driving IC are supported by the reinforcement member disposed at the back of the chassis base, the connection of the TCP may become weak or the contact between the driving ICs and the reinforcement members may deteriorate, and thus, heat radiation may deteriorate.

Also, when the TCP is supported by the reinforcement member installed in the chassis base, a distance between the driving board to the plasma display panel is long, and thus, many expensive TCPs are required, and thus, the material cost increases.

Also, the height of the reinforcement member installed at the back of the chassis base may restrict reducing the thickness of the plasma display device.

Hereinafter, embodiments of the present invention will be described more fully with reference to the accompanying drawings, in which exemplary embodiments of the invention are shown.

Figure 1:
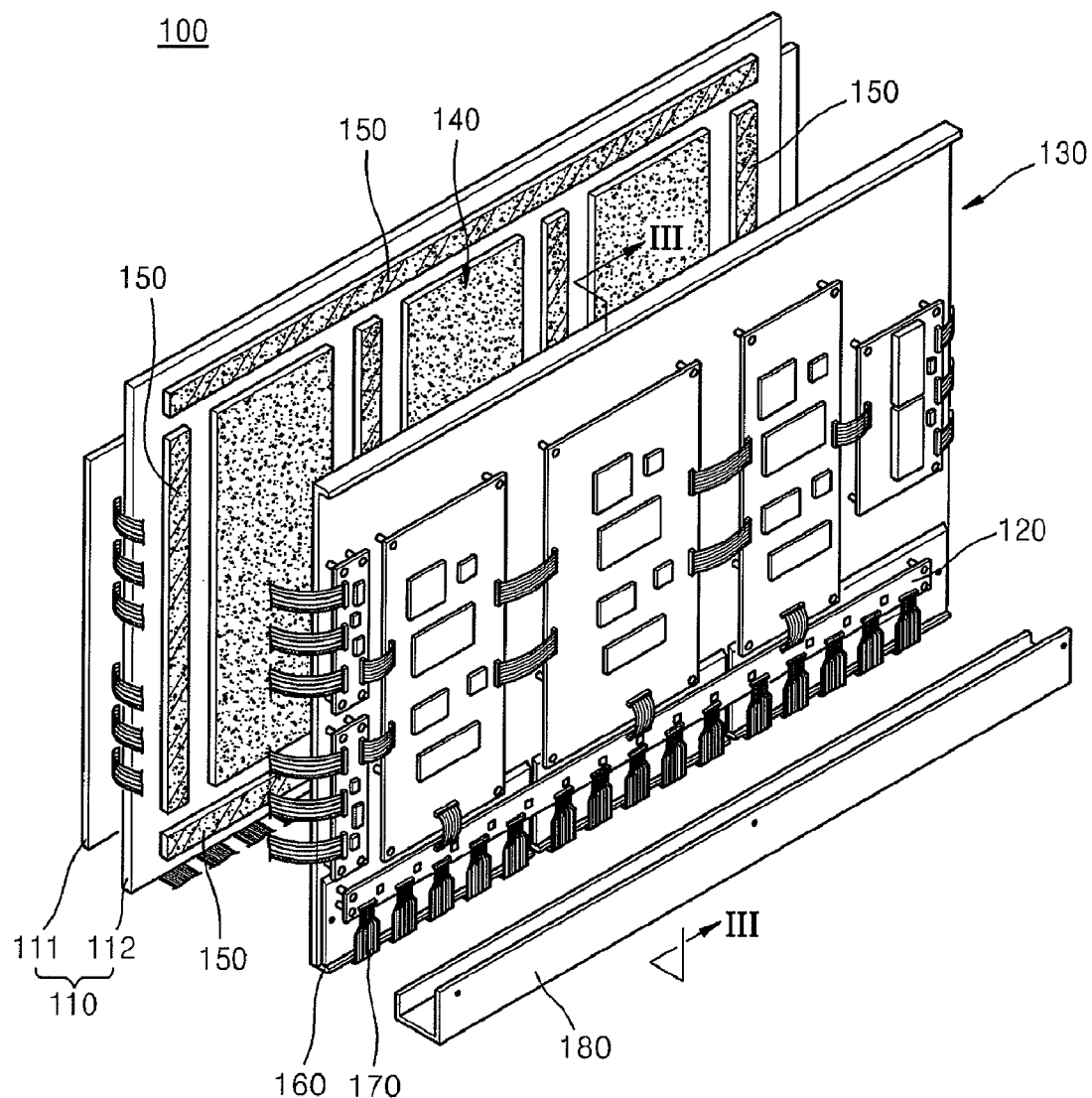
FIG. 1 is an exploded perspective view of a plasma display device according to an embodiment of the present invention.
Figure 2:
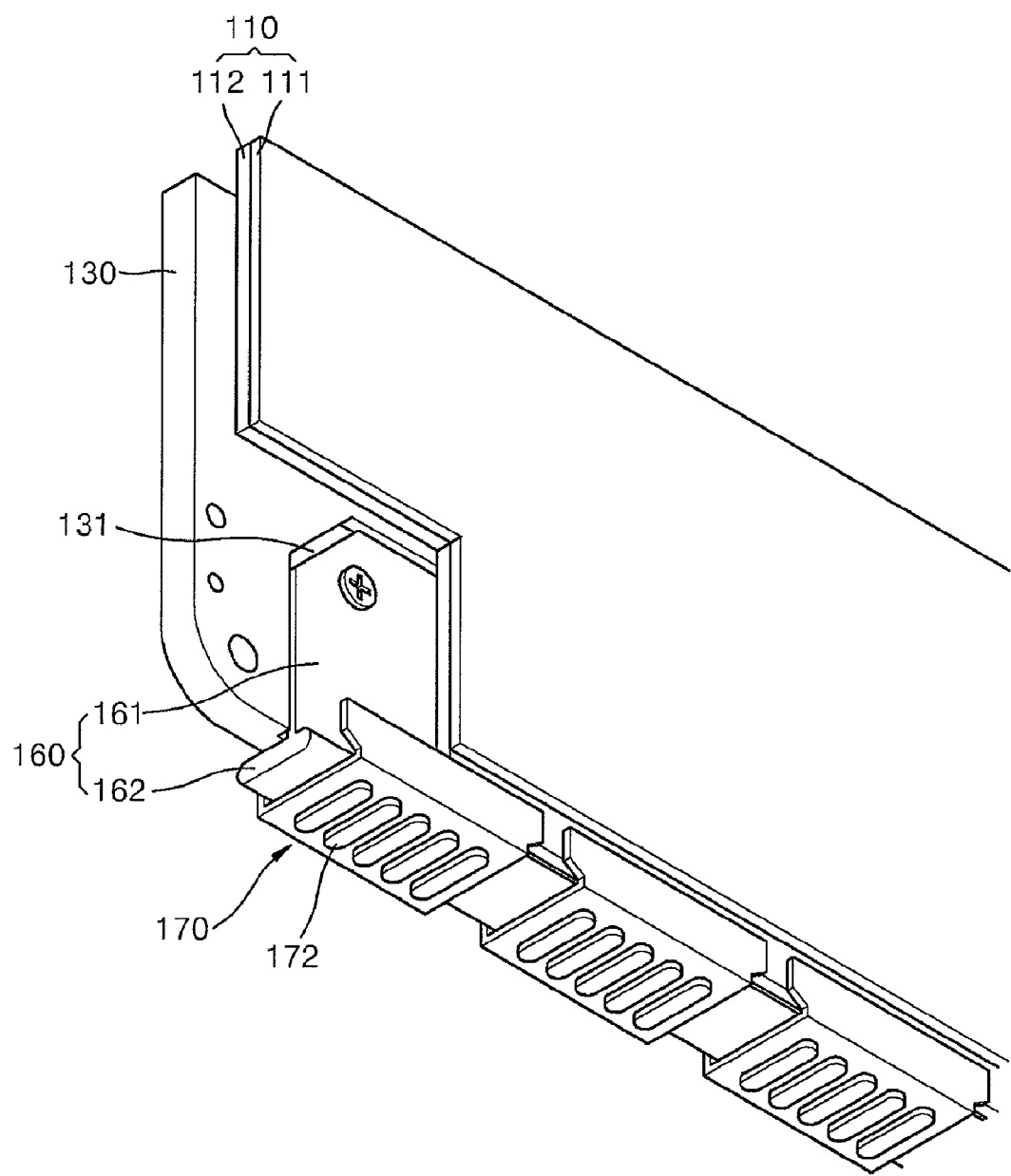
FIG. 2 is a partial sectional perspective view of a plasma display panel of the plasma display device of FIG. 1.
Figure 3:
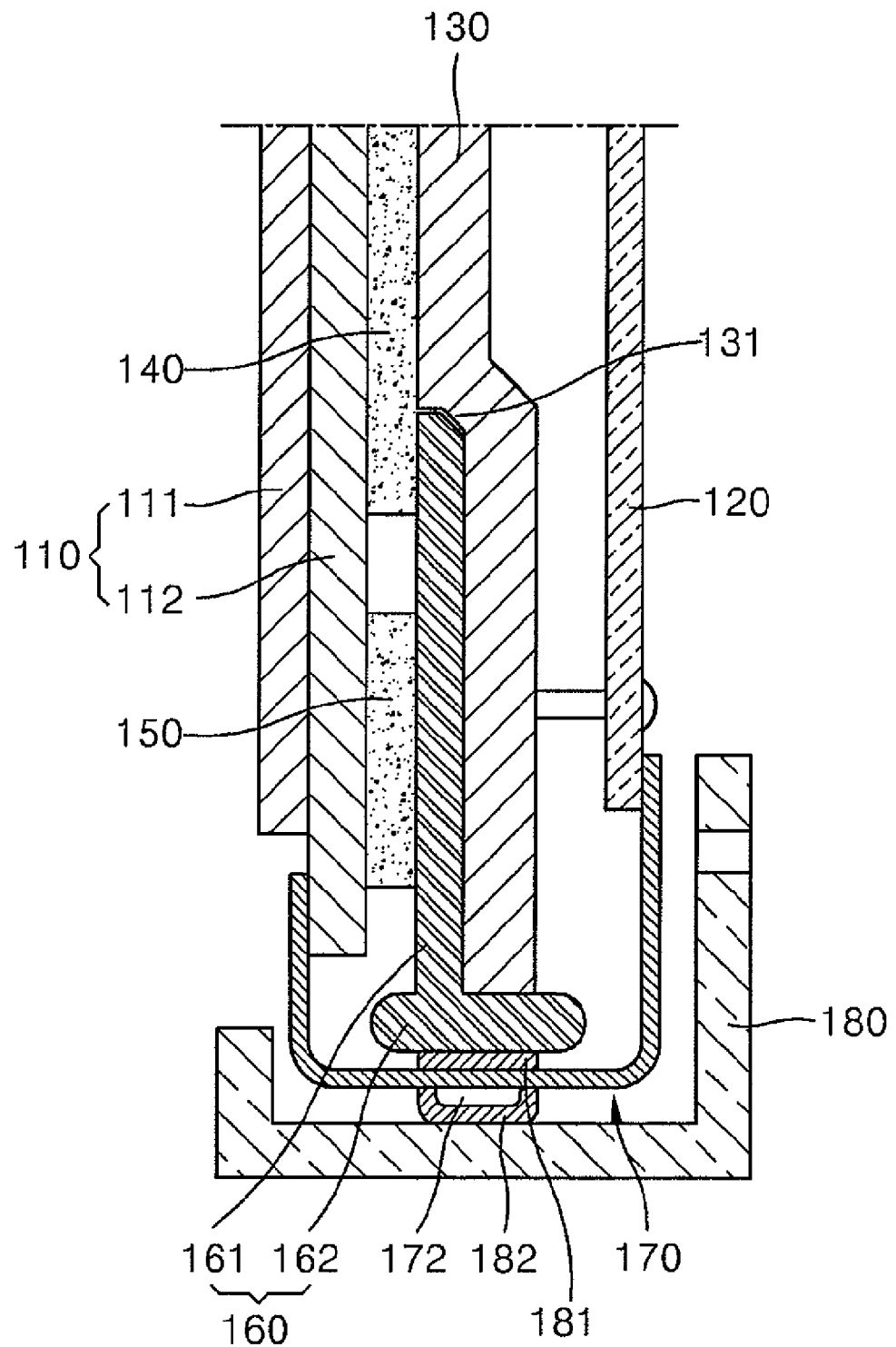
FIG. 3 is a partial cross-sectional view taken along a line of the plasma display device of FIG. 1.

FIG. 1 is an exploded perspective view of a plasma display device 100 according to an embodiment of the present invention, FIG. 2 is a partial sectional perspective view of a plasma display panel (PDP) 110 (not shown in FIG. 2) of the plasma display device of FIG. 1, and FIG. 3 is a partial cross-sectional view taken along a line III-III of the plasma display device of FIG. 1.

In one embodiment, the plasma display device 100 includes the PDP 110 displaying an image, a chassis base 130 disposed at the back of the PDP 110, an auxiliary chassis 160 disposed between the PDP 110 and the chassis base 130, a driving board 120 disposed at the back of the chassis base 130, and at least one signal transmission member 170 connecting the PDP 110 and the driving board 120.

The PDP 110 includes a front substrate 111 and a rear substrate 112 that face each other. A plurality of discharge spaces that are defined by barrier ribs are formed between the front substrate 111 and the rear substrate 112, and an address electrode and a display electrode (a pair of a sustain electrode and an address electrode) cross each other in each of the discharge spaces. When a driving signal is applied between the address electrode and the display electrode, gas discharge is generated in the discharge space, and visible rays are emitted from the discharge space to the front substrate 111 by the gas discharge, thereby displaying an image.

The chassis base 130 is installed at the back of the rear substrate 112 of the PDP 110. In one embodiment, the chassis base 130 is formed of a material having high thermal conductivity such as aluminum, and thus, supports the PDP 110 so that the PDP 110 is not damaged from an external shock and emits heat received from the PDP 110.

In one embodiment, a heat radiation sheet 140 and a double-sided adhesive tape 150 are disposed between a rear side of the PDP 110 and a front side of the chassis base 130. The heat radiation sheet 140 diffuses heat generated in the PDP 110 to a flat surface direction of the PDP 110 by the gas discharge. The heat radiation sheet 140 may be formed of an acrylic heat radiation material, graphite heat radiation material, metallic heat radiation material, or a carbon nano tube heat radiation material, which have excellent thermal conductivity.

Also, since the double-sided adhesive tape 150 attaches the PDP 110 and the chassis base 130, the heat radiation sheet 140 is firmly attached to the rear side of the PDP 110 and the front side of the chassis base 130.

The driving board 120 driving the PDP 110 is installed at the back of the chassis base 130. The driving board 120 includes a signal controller that realizes an image by controlling an image signal applied to the PDP 110, a power module that supplies power to the signal controller, etc. The signal controller includes integrated circuit chips for controlling an electric signal applied to the address electrode and the display electrode of the PDP 110 to drive the PDP 110.

The driving board 120 and the PDP 110 are electrically connected to each other with the signal transmission member 170 that is bendable. The signal transmission member 170 may be a flexible printed circuit board (FPCB) having a circuit pattern for transmitting an electric signal, and may include at least one circuit device 172 installed in the FPCB.

The PDP 110 supported by the chassis base 130 addresses a discharge cell by using the address electrode and the display electrode included in the PDP 110, and realizes an image by sustain-discharging the discharge cell. The address electrode and the display electrode in the PDP 110 are connected to the driving board 120, and thus are controlled according to a control signal of the driving board 120.

The address electrode of the PDP 110 is connected to the driving board 120 via the circuit device 172, i.e., the signal transmission member 170 including a driver IC. An address pulse is applied to the address electrode via the driver IC. The driver IC may repeatedly apply the address pulse to a corresponding address electrode within a short time for gray scale expression in the PDP 110, and thus generates high heat while the PDP 110 is operated.

In order to effectively emit heat generated in the signal transmission member 170, the signal transmission member 170 contacts the auxiliary chassis 160 and a protection plate 180. The auxiliary chassis 160 supports the signal transmission member 170 while transmitting heat to the chassis base 130. The auxiliary chassis 160 may be formed of a material having sufficient hardness and thermal conductivity so as to strengthen the hardness of the chassis base 130.

Figure 4:
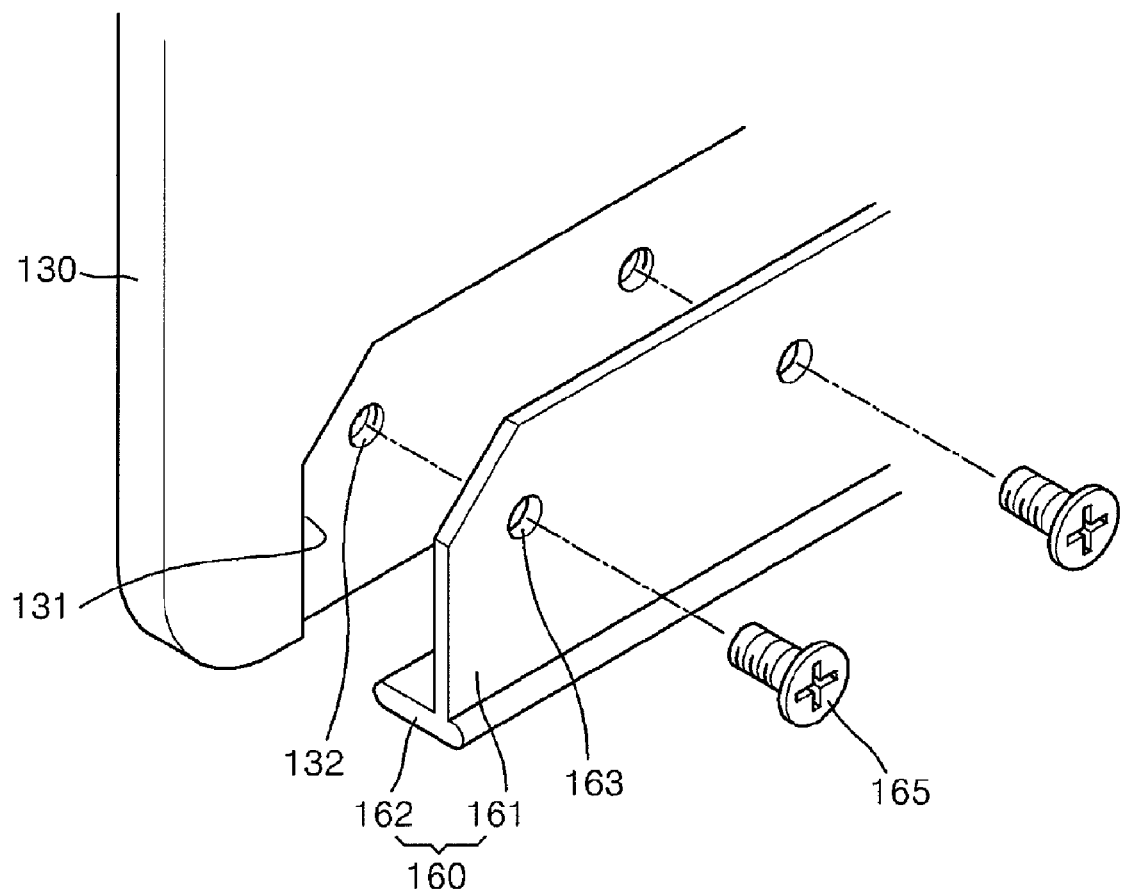
FIG. 4 is a partial exploded perspective view of a chassis base of the plasma display device of FIG. 1.

FIG. 4 is a partial exploded perspective view of the chassis base 130 of the plasma display device of FIG. 1.

The auxiliary chassis 160 includes an installer 161 disposed between the chassis base 130 and the PDP 110, and a supporter 162 bent to cover at least a portion of a side of the chassis base 130 by protruding from an end of the installer 161 to an outer side of the chassis base 130. A groove 131 is formed in the front side of the chassis base 130 facing the PDP 110. The installer 161 of the auxiliary chassis 160 is inserted and fixed in the groove 131.

A width of the installer 161, i.e., the length covering a side thickness of the chassis base 130, may be determined according to a length of the circuit device 172. In other words, when the length of the circuit device 172 of the signal transmission member 170 is small, the width of the installer 161 may be small, and when the length of the circuit device 172 is large, the width of the installer 161 may be large. As such, according to a combined structure of the chassis base 130 and the auxiliary chassis 160, the combined structure suitably deals with the length of the circuit device 172 of the signal transmission member 170, without increasing the thickness of the chassis base 130, by only changing the width of the installer 161. Accordingly, the entire thickness of the chassis base 130 is minimized.

The auxiliary chassis 160 may be fixed in the groove 131 via various methods. In one embodiment of the present invention, the installer 161 is combined to the groove 131 with a screw 165 that is screwed into a screw hole 132 of the chassis base 130 and a thru hole 163 of the installer 161. However, the present invention is not limited to such a structure, and the auxiliary chassis 160 may be connected to the groove 131 via a welding or rivet connection, or the auxiliary chassis 160 may be inserted to a rail formed on the chassis base 130.

Referring to FIG. 3, one side of the signal transmission member 170 may be supported by the auxiliary chassis 160. The signal transmission member 170 may contact the auxiliary chassis 160 by disposing a first heat transmission member 181 therebetween. The first heat transmission member 181 maintains its adhesiveness so that the signal transmission member 170 and the supporter 162 of the auxiliary chassis 160 contact each other, and may be formed of a material having excellent thermal conductivity so that heat generated in the signal transmission member 170 is transmitted to the auxiliary chassis 160. The first heat transmission member 181 may be thermal grease or a thermal conduction sheet.

The signal transmission member 170 connecting the driving board 120 and the PDP 110 (not shown in FIG. 3) extends from the driving board 120, over a side of the chassis base 130 and a side of the PDP 110. As described above, since the circuit device 172 of the signal transmission member 170 is supported by the supporter 162 of the auxiliary chassis 160 protruding on the side of the chassis base 130, a length of the signal transmission member 170 is shorter than a length of a typical signal transmission member that is supported by a reinforcement member (generally much greater in height than the auxiliary chassis 160) separately installed in a chassis base. Accordingly, material costs are reduced.

Also, a separate reinforcement member is not required to support the circuit device 172 and spaces at sides of the chassis base 130 and the PDP 110 are available, and thus the entire thickness of the chassis base 130 is reduced.

As described above, since the auxiliary chassis 160 supporting the signal transmission member 170 is disposed between the PDP 110 and the chassis base 130 and fixed in the groove 131 of the chassis base 130, the auxiliary chassis 160 bends substantially in the same radius of curvature as the PDP 110 and the chassis base 130, even when the PDP 110 and the chassis base 130 bends at the edges due to the weight of a large screen of the plasma display device. Accordingly, even when the edges bend, the connection between the signal transmission member 170 and the auxiliary chassis 160 does not deteriorate, and thus heat is radiated well.

The circuit device 172 may be disposed on a surface of the signal transmission member 170 that is opposite of a surface where the first heat transmission member 181 is attached to. The plasma display device 100 may further include the protection plate 180 combined to the chassis base 130 so as to cover the signal transmission member 170. Here, the circuit device 172 is disposed on a surface of the signal transmission member 170 facing the protection plate 180, and contacts the protection plate 180 while disposing a second heat transmission member 182 therebetween.

The protection plate 180 is fixed on a back side of the chassis base 130 via a combining means such as a screw, thereby externally and smoothly emitting heat generated in the signal transmission member 170 while protecting the signal transmission member 170 from being damaged. Accordingly, the protection plate 180 may be formed of a metal material having thermal conductivity.

The second heat transmission member 182 disposed between the protection plate 180 and the circuit device 172 of the signal transmission member 170 may be formed of thermal grease or a thermal conduction sheet.

As the resolution of the PDP 110 increases, a technology of structuring an electrode becomes precise and detailed, and thus a circuit pattern of the signal transmission member 170 becomes more precise, and the number of circuit devices 172 remarkably increases. Accordingly, when the circuit device 172 is disposed on the signal transmission member 170, a longitudinal direction of the circuit device 172 may be disposed to face a direction that the signal transmission member 170 extends from the driving board 120 to the PDP 110. According to such a structure, many circuit devices 172 may be disposed in a small space of the signal transmission member 170 so as to cope with the precise and detailed PDP 110. Also, material costs are reduced by minimizing the width of the signal transmission member 170.

As described above, a display device includes a chassis base assembly that is suitable in a display panel that is thin and large, and is precise and detailed to realize a high resolution image.

According to at least one embodiment, a circuit device of a signal transmission member is supported by an auxiliary chassis protruding to a side of a chassis base, and thus a length of the signal transmission member is decreased. Accordingly, material costs are reduced.

Moreover, a separate reinforcement member is not required to support the circuit device, and spaces in sides of the chassis base and a PDP are available. Accordingly, an entire thickness of the chassis base is reduced.

Also, even when the edges of the PDP and the chassis base bend due to weight as the display device is enlarged, an auxiliary chassis bends substantially at the same radius of curvature as the PDP and the chassis base. Accordingly, the connection between the signal transmission member and the auxiliary chassis does not deteriorate, and thus heat is radiated well.

In addition, the circuit device may be disposed in a longitudinal direction along the direction that the signal transmission member extends from the circuit boards to the PDP, and thus many circuit devices are disposed in a small space of the signal transmission member. Accordingly, material costs of the signal transmission member are reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display device comprising:
    a display panel configured to display an image;
    a chassis base configured to support the display panel;
    an auxiliary chassis disposed between the display panel and the chassis base, wherein one end of the auxiliary chassis covers an edge of the chassis base;
    a driving board disposed at the back of the chassis base and configured to drive the display panel; and
    at least one signal transmission member comprising at least one circuit device and configured to electrically connect the display panel and the driving board, wherein one side of the at least one signal transmission member is supported by the auxiliary chassis,
    wherein a groove is defined in a surface of the chassis base, wherein the surface faces the display panel,
    and wherein the auxiliary chassis comprises i) an installer, which is formed in the groove and disposed between the display panel and the chassis base, and ii) a supporter, which is formed at the end of the installer to cover and contact the edge of the chassis base.

2. The display device of claim 1, wherein the signal transmission member is a tape carrier package or a chip on film.

3. The display device of claim 1, further comprising a first heat transmission medium, wherein the first heat transmission medium comprises first and second surfaces opposing each other, wherein the first surface contacts the supporter, and wherein the second surface contacts the signal transmission member.

4. The display device of claim 3, wherein the first heat transmission member is thermal grease or a thermal conduction sheet.

5. The display device of claim 3, wherein the signal transmission member comprises first and second surfaces opposing each other, wherein the first surface of the signal transmission member contacts the first heat transmission medium, and wherein the circuit device is disposed on the second surface of the signal transmission member.

6. The display device of claim 5, further comprising a second heat transmission member contacting the second surface of the signal transmission member and covering the circuit device.

7. The display device of claim 6, further comprising a protection plate covering a substantial portion of the at least one signal transmission member so as to protect the signal transmission member.

8. The display device of claim 7, wherein a cross-section of the protection plate has a substantially similar shape to that of each of the at least one signal transmission member.

9. The display device of claim 7, wherein the protection plate contacts the second heat transmission member.

10. A display device comprising:
a display panel configured to display an image;
a chassis base configured to support the display panel, wherein the chassis base comprises i) first and second linear portions, and ii) a connection portion which are integrally formed into the chassis base, wherein the connection portion interconnects the first and second linear portions, and wherein the connection portion is bent outwardly from the first linear portion to the second linear portion such that the second linear portion is farther than the first linear portion from the display panel;
an auxiliary chassis a substantial portion of which is formed between the display panel and the second linear portion of the chassis base, wherein the auxiliary chassis is smaller and shorter than the chassis base; and
at least one signal transmission member configured to transmit at least a driving signal to the display panel, wherein one side of the at least one signal transmission member is supported by the auxiliary chassis,
wherein the auxiliary chassis comprises i) a first portion and ii) a second portions which extends from the first portion and is substantially perpendicular to the first portion, wherein the first portion is formed between the display panel and the chassis base, and wherein the first portion of the auxiliary chassis is substantially parallel with the second linear portion of the chassis base.

11. The display device of claim 10, wherein the second linear portion of the chassis base comprises first and second surfaces, wherein the first surface of the chassis base faces the display panel and is substantially perpendicular to the second surface, wherein the first portion of the auxiliary chassis contacts the first surface of the chassis base, and wherein the second portion of the auxiliary chassis contacts the second surface of the chassis base.

12. The display device of claim 10, wherein the first portion of the auxiliary chassis contacts the second linear portion and the connection portion of the chassis base.

13. The display device of claim 10, further comprising an adhesive tape formed between the display panel and the chassis base, wherein the first portion of the auxiliary chassis contacts the adhesive tape.

14. The display device of claim 13, further comprising a heat radiation sheet formed between the display panel and the chassis base, wherein the first portion of the auxiliary chassis contacts the heat radiation sheet.

15. The display device of claim 10, further comprising a first heat transmission medium interposed between the second portion of the auxiliary chassis and a first surface of the signal transmission member.

16. The display device of claim 15, further comprising i) at least one circuit device formed on a second surface of the signal transmission member and ii) a second heat transmission member contacting the second surface of the signal transmission member and covering the circuit device, and wherein the first and second surfaces of the signal transmission member are opposing to each other.

17. The display device of claim 16, further comprising a protection plate which contacts the second heat transmission member, wherein a cross-section of the protection plate has a substantially similar shape to that of each of the at least one signal transmission member.

18. A display device comprising:
a display panel configured to display an image;
a chassis base configured to support the display panel, wherein a groove is defined in a surface of the chassis base, wherein the surface faces the display panel;
an auxiliary chassis, a substantial portion of which is formed in the groove of the chassis base, wherein at least a portion of the auxiliary chassis contacts an edge of the chassis base and is not formed between the display panel and chassis base, and wherein the edge of the chassis base is substantially perpendicular to the surface of the chassis base;
a driving board connected to the chassis base and configured to generate a driving signal for the display panel;
at least one signal transmission member configured to transmit the driving signal to the display panel, wherein one side of the at least one signal transmission member is supported by the auxiliary chassis; and
a protection plate covering a substantial portion of the at least one signal transmission member so as to protect the signal transmission member.

\* \* \* \* \*